United States Patent [19]
Engles et al.

[11] Patent Number: 4,829,351
[45] Date of Patent: May 9, 1989

[54] POLYSILICON PATTERN FOR A FLOATING GATE MEMORY

[75] Inventors: Bruce E. Engles; Gianfranco Gerosa, both of Austin, Tex.

[73] Assignee: Motorola, Inc., Schaumburg, Ill.

[21] Appl. No.: 26,357

[22] Filed: Mar. 16, 1987

[51] Int. Cl.[4] .................... H01L 29/78; H01L 29/04; G11C 5/02; G11C 11/34

[52] U.S. Cl. ...................... 357/23.5; 357/59; 365/185; 365/51

[58] Field of Search ................. 365/51, 185; 357/23.6, 357/23.9, 42, 45, 59 J, 23.5

[56] References Cited

U.S. PATENT DOCUMENTS

| | | | |
|---|---|---|---|
| 4,475,118 | 10/1984 | Klein et al. | 357/59 J |
| 4,531,203 | 7/1985 | Masuoka et al. | 365/185 |
| 4,561,004 | 12/1985 | Ruo et al. | 365/185 |
| 4,663,645 | 5/1987 | Komori et al. | 357/23.5 |
| 4,679,171 | 7/1987 | Logwood et al. | 365/154 |
| 4,709,351 | 11/1987 | Kajigaya | 365/51 |

*Primary Examiner*—Terrell W. Fears
*Assistant Examiner*—Melissa J. Koval
*Attorney, Agent, or Firm*—James L. Clingan, Jr.

[57] ABSTRACT

An integrated circuit floating gate memory is formed using two layers of polysilicon. The first layer of polysilicon is patterned twice, once before the second polysilicon layer is deposited, and again as part of the etch of the second layer of polysilicon. Stringers of the second layer of polysilicon can form along the edge of the first etch of the first layer of polysilicon. The first etch of the first layer of polysilicon is patterned so that even if these stringers are subsequently formed, there is no harm.

3 Claims, 8 Drawing Sheets

POLYSILICON PATTERN FOR A FLOATING GATE MEMORY

FIELD OF THE INVENTION

The present invention relates to floating gate memories, and more particularly, to a patterning technique of polysilicon to overcome a stringer problem.

BACKGROUND OF THE INVENTION

In an MOS integrated circuit in which there are two layers of polysilicon there is a generally known problem known as stringers. A stringer is a relatively small string of polysilicon which is intended to be removed but which is left after an etch step. This remaining string of polysilicon can cause a short circuit between two or more circuit elements that are not supposed to be shorted together.

SUMMARY OF THE INVENTION

An object of the present invention is to provide an integrated circuit with improved immunity to stringers.

Another object of the invention is to provide a floating gate memory with improved immunity from stringers.

Yet another object of the invention is to provide a polysilicon pattern which improves the immunity of a floating gate memory to stringers.

These and other objects are achieved in an integrated circuit memory having an array of floating gate transistors. Each floating gate transistor has a gate connected to a respective word line, a drain connected to a respective bit line at a respective bit line connecting node, and a source connected to a respective common source line. The word lines run generally in a first direction. The floating gate transistors are formed of a first layer of polysilicon and a second layer of polysilicon. The first layer of polysilicon is deposited and etched into a pattern prior to application of the second polysilicon. The pattern of the first layer of polysilicon comprises strips of polysilicon running orthogonal to the first direction. The pattern further has bridges of polysilicon connecting the strips of polysilicon. The bridges of polysilicon are located between the bit line connecting nodes.

DESCRIPTION OF THE INVENTION

Figure 1:
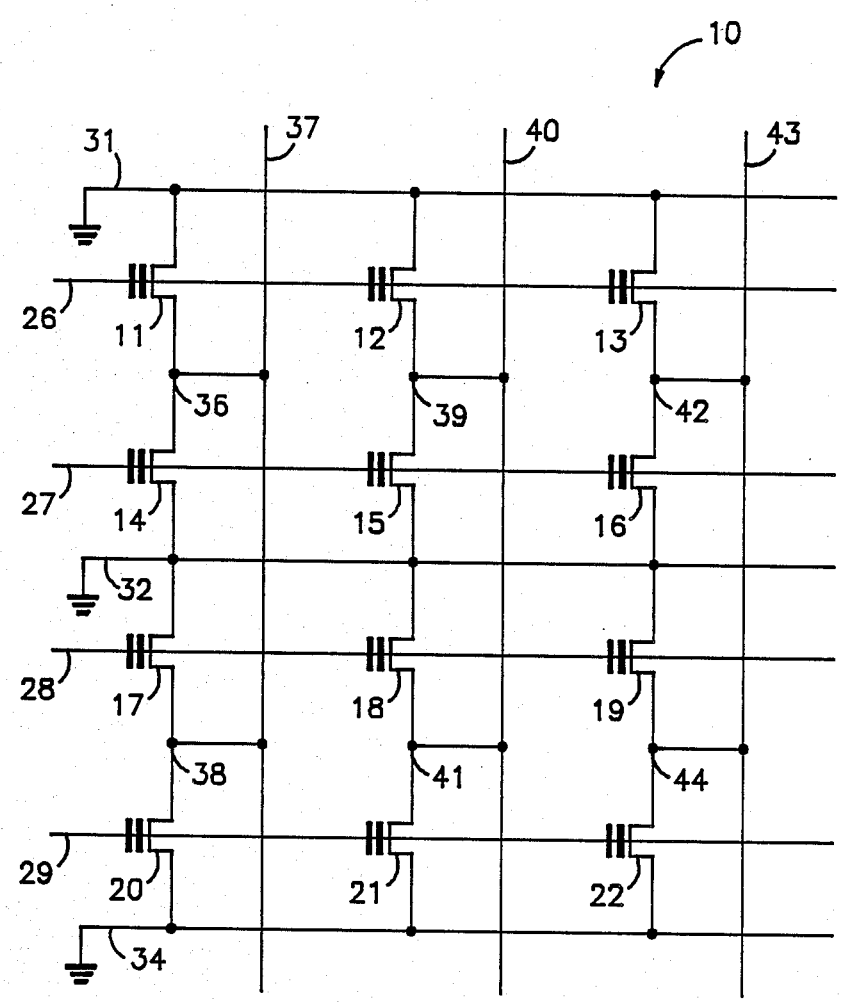
FIG. 1 is a portion of a conventional floating gate memory to which the present invention is applicable.

Because the present invention is implemented with a novel polysilicon pattern in a conventional floating gate memory array made using a conventional process, the conventional memory and the conventional process for making this memory will be described first. Shown in FIG. 1 is a circuit diagram of a portion of a memory 10 comprised of floating gate memory cells 11, 12, 13, 14, 15, 16, 17, 18, 19, 20, 21, and 22. Each of memory cells 11-22 is a floating gate transistor having a control gate, a floating gate, a drain, and a source. The control gates of memory cells 11-13 are connected to a word line 26. The control gates of cells 14-16 are connected to a word line 27. The control gates of cells 17-19 are connected to a word line 28. The control gates of cells 20-22 are connected to a word line 29. The sources of transistors 11-13 are connected to ground via a ground line 31. The sources of transistors 14-19 are connected to ground via a ground line 32. The sources of transistors 20-22 are connected to ground via a ground line 34. The drains of transistors 11 and 14 are connected together at a node 36 and to a bit line 37. The drains of transistors 17 and 20 are connected together at a node 38 and to bit line 37. The drains of transistors 12 and 15 are connected together at a node 39 and to a bit line 40. The drains of transistors 18 and 21 are connected together at a node 41 and to bit line 40. The drains of transistors 13 and 16 are connected together at a node 42 and to a bit line 43. Transistors 19 and 22 are connected together at a node 44 and to bit line 43. This is a conventional connection scheme for a floating gate memory. The common source ground lines 31, 32, and 34 are shown as connected directly to ground. There may be intervening coupling circuitry between the common source ground lines 31, 32, and 34 and ground. There are circumstances in which it may be desirable for the sources of the floating gate transistors to not be coupled to ground and instead be floating, or even tied to some voltage. Such intervening coupling circuitry, if used, would be for those situations. The presence of such coupling circuitry, however, is not necessary for understanding the present invention.

Figure 2:
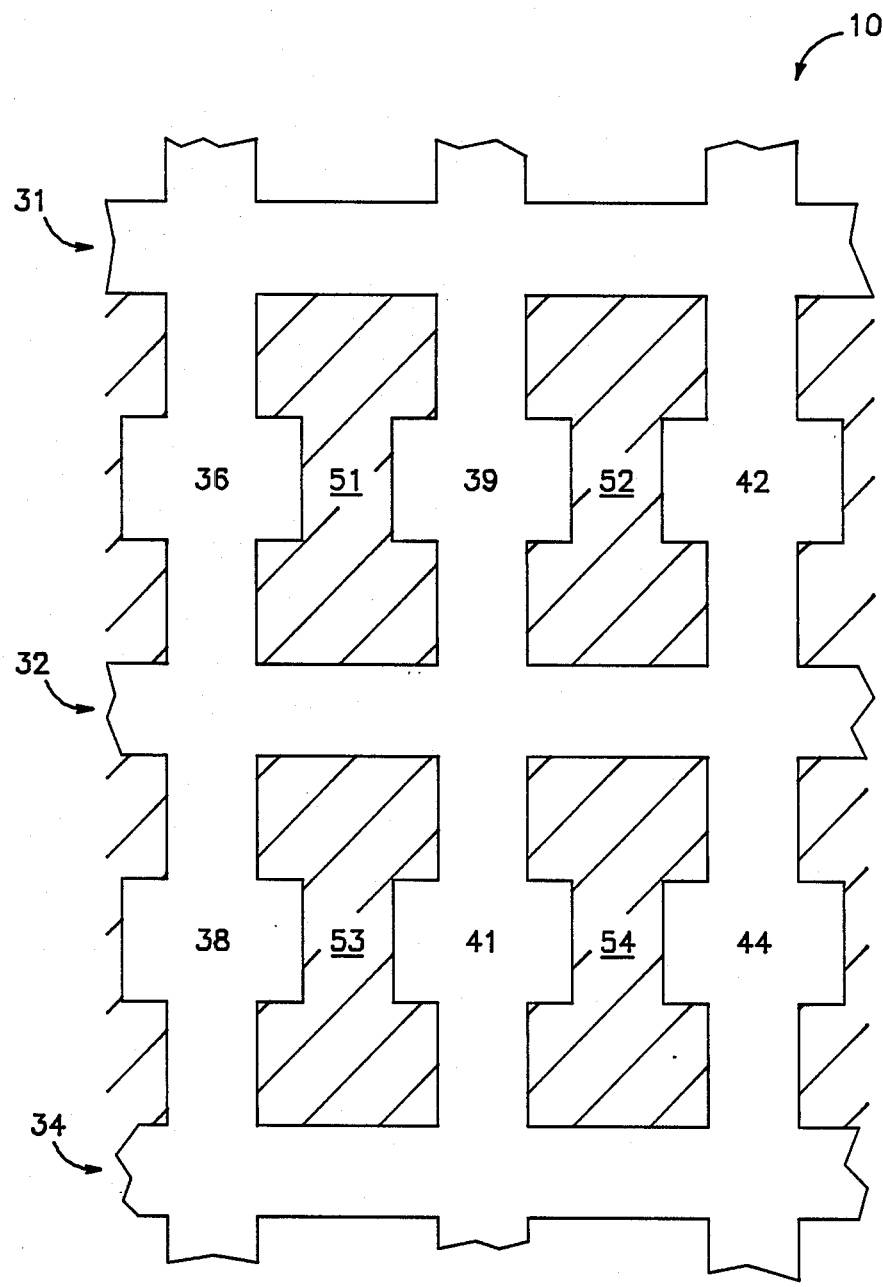
FIG. 2 is a topographical view of the memory of FIG. 1 at a first conventional stage in processing.

Shown in FIG. 2 is a layout of memory 10 showing field oxide regions 51, 52, 53, and 54 which define active regions. Field oxide regions 51-54 are shown as cross-hatched regions each having a wider upper and lower region and a thinner middle region. The thinner middle region results in a wider region of active region which is for making contact to a bit line. These wider regions in the active region are nodes 36, 48, 39, 41, 42, and 44 shown in both FIG. 1 and FIG. 2. The active areas running from left to right are common ground lines 31, 32, and 34. Transistors 11-22 are formed, as a consequence of subsequent processing, in the necked down active region between the common nodes for making bit line connections and the common ground lines. For example transistor 11 will be subsequently formed in the necked down region of the active region between node 36 and common ground line 31. Transistor 14 will be formed between node 36 and ground line 32.

Figure 3:
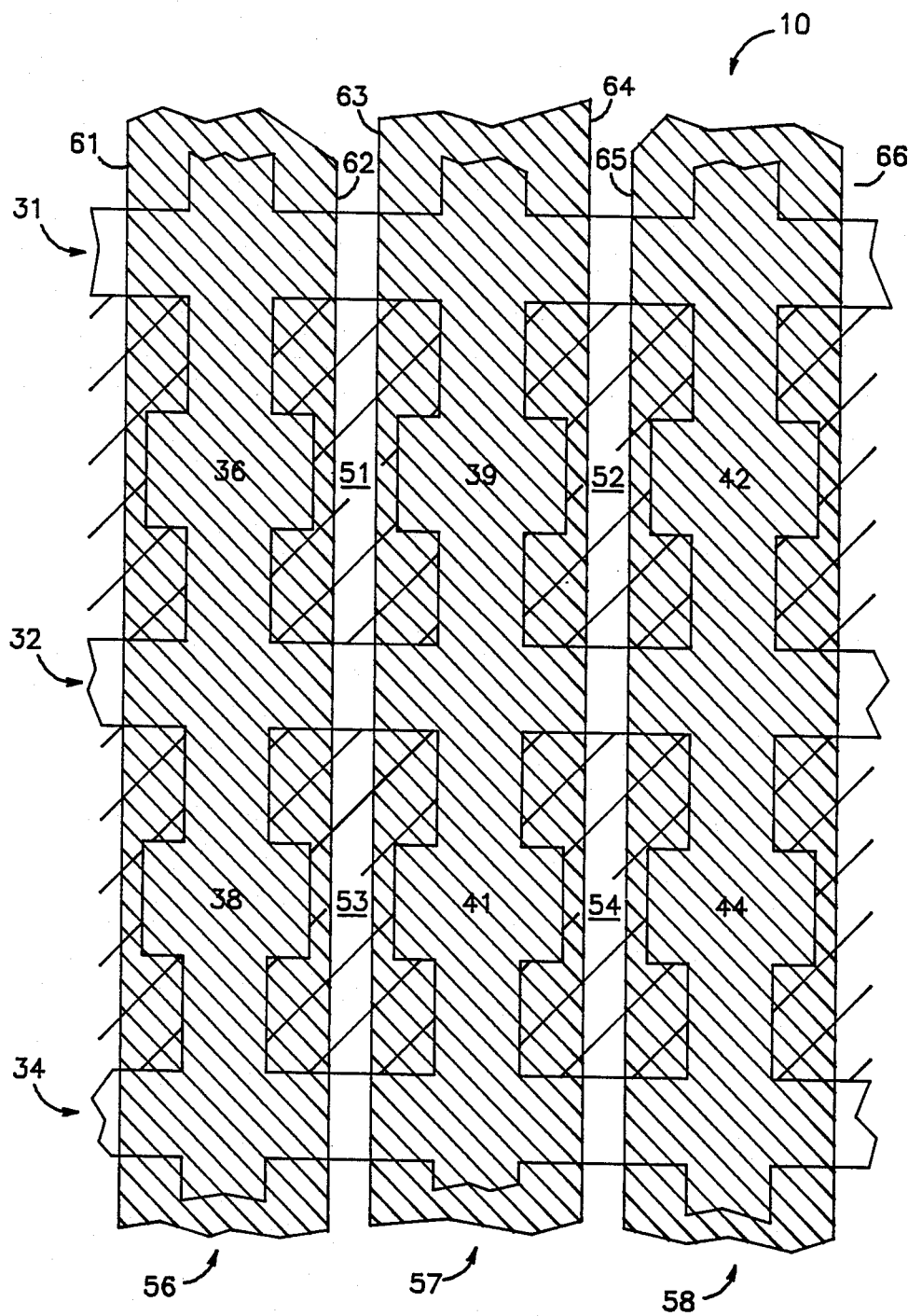
FIG. 3 is a topographical view of the memory of FIG. 1 at a second conventional stage in processing.

Shown in FIG. 3 is the layout of memory 10 of FIG. 2 but with an added first layer of polysilicon which has been patterned in conventional fashion. The first polysilicon layer is patterned into polysilicon strip 56, polysilicon strip 57, and polysilicon strip 58. Polysilicon strips 56, 57, and 58 run from top to bottom and are shown as being cross-hatched. Polysilicon strip 56 is bounded on the left by an edge 61 and on the right by an edge 62. Polysilicon strip 57 is bounded on the left an an edge 63 and on the right by an edge 64. Polysilicon strip 58 is bounded on the left by an edge 65 and on the right by an edge 66. The first polysilicon layer is for the floating gate of transistors 11-22. Portions of polysilicon strip 56 will be used for the floating gates of transistors 11, 14, 17, and 20. Portions of polysilicon strip 57 will form the floating gates of transistors 12, 15, 18, and 21. Portions of polysilicon strip 58 will form the floating gates of transistors 13, 16, 19, and 22. The area between polysilicon strips 56-58 separates the floating gates of transistors of memory cells that are connected to the same word line. The area between edge 62 and edge 63 separates the floating gates of transistors 11, 14, 17, 20 from the floating gates of transistors 12, 15, 18, and 21. The area between edge 64 and 65 separates the floating gates of transistors 12, 15, 18, and 21 from the floating gates of transistors 13, 16, 19, and 22. After a second layer of polysilicon has been deposited, both the first and second polysilicon layers will be patterned together in a conventional self-aligned process for floating gate transistors which will separate the floating gates of the transistors of a particular polysilicon strip while also defining the channel of the transistor.

Figure 4:
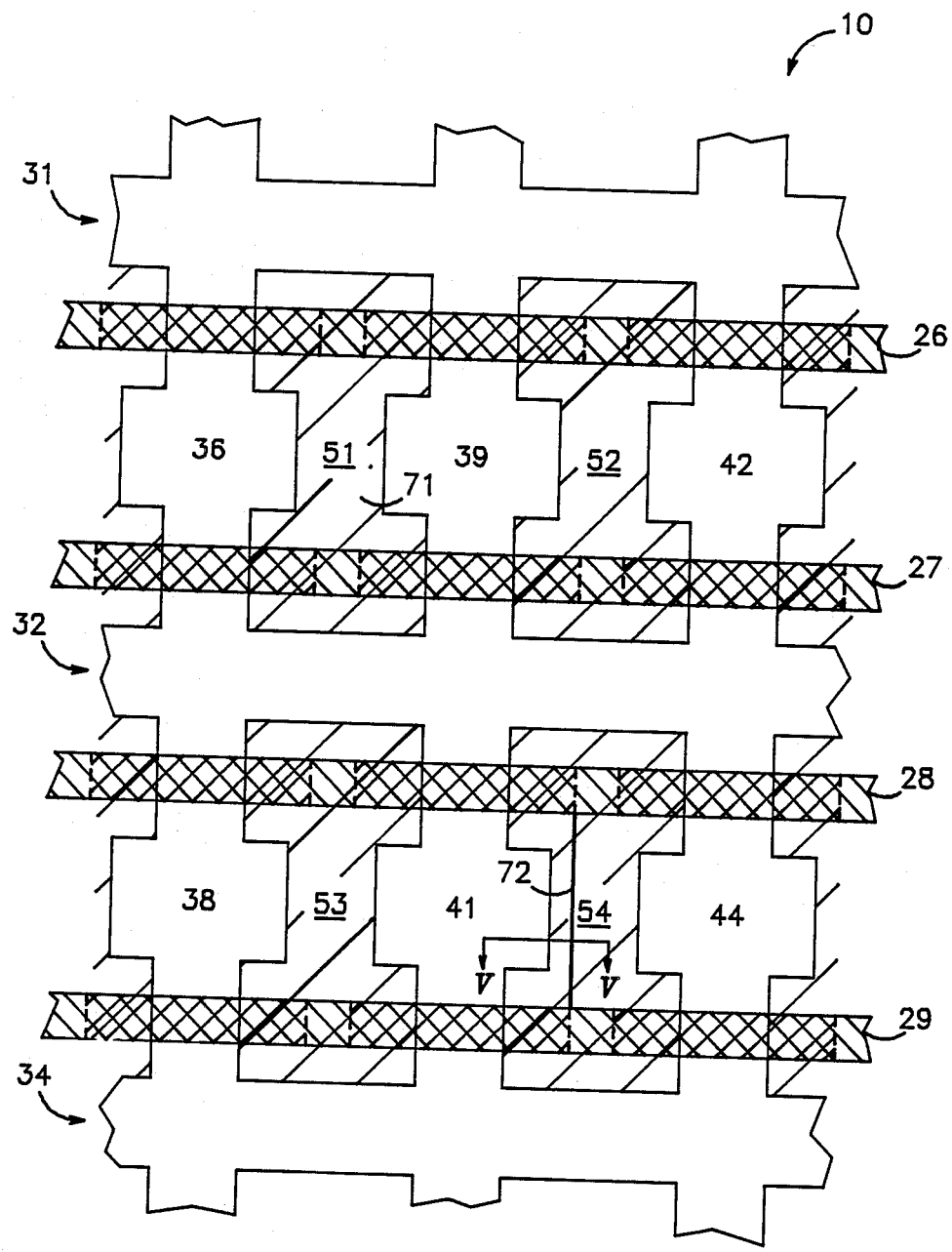
FIG. 4 is a topographical view of the memory of FIG. 1 at a third conventional stage in processing.

Shown in FIG. 4 is the layout of memory 10 of FIG. 3 with an added second layer of polysilicon which has been etched. There are shown four polysilicon strips which are word lines 26, 27, 28, and 29. Word lines 26-29 run from left to right and are orthogonal to polysilicon strips 56-58 shown in FIG. 3. Word lines 26-29 are shown as perfectly straight but there are other floating gate memories in which the word lines are not perfectly straight but have somewhat of a zig-zag pattern while still running from left to right. In the situations in which this is done, it is done for optimizing bit cell performance. Even if the word lines are zig-zagged, they still run left to right and are generally orthogonal to polysilicon strips 56-58 shown in FIG. 3.

Polysilicon strips 26-29 also form the gates of memory cells 11-22. Under the word lines are floating gates for each memory cell. The boundaries of the floating gates are designated by dotted lines. The boundaries of the floating gates are aligned with edges 61-66 of polysilicon strips shown in FIG. 3. Also shown in FIG. 4 are polysilicon stringers 71 and 72. Polysilicon stringers 71 and 72 are undesirable strings of polysilicon which can be formed in a typical process. Polysilicon stringers 71 and 72 are not always formed but when they are formed they short adjoining word lines together, which is of course undesirable. A shorting of a few word lines together may be all that is wrong with a particular integrated circuit die. Additionally, a wafer may have some dice with a stringer problem but others may not. Polysilicon stringers 71 and 72 are unetched portions of the second layer of polysilicon formed at edge 63 and edge 64, respectively, of polysilicon strip 57 shown in FIG. 3. The edge of the etched portion of the first layer of polysilicon is the location where a stringer may occur.

Figure 5A:
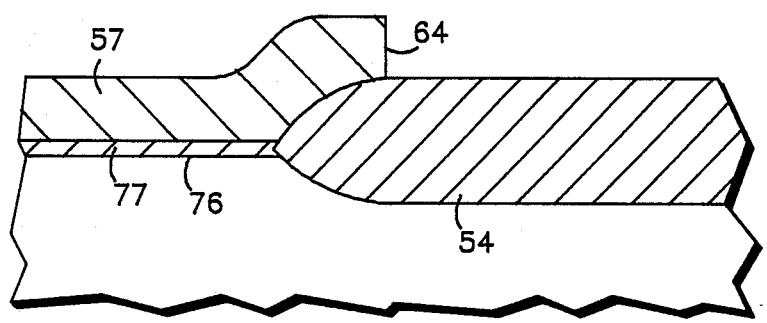
FIGS. 5A-5F are cross-sectional views of a portion of the memory of FIG. 1 at various stages in conventional processing showing the formation of a stringer.

Shown in FIGS. 5A-5E is a cross-section taken at line V—V of FIG. 4 which is the location of the formation of stringer 72. Each of FIGS. 5A-5E shows this location at a different stage in processing. Shown in FIG. 5A is polysilicon strip 57 and its edge 64 overlying field oxide 54. Memory 10 is formed on a semiconductor substrate 76. Between polysilicon layer 57 and substrate 76 is a thin oxide 77 which is used for separating the floating gates of transistors 11-22 from substrate 76. This gate oxide layer 77 is also formed between polysilicon strip 57 and field oxide 54 although it is difficult to distinguish the gate oxide from the field oxide in the area over field oxide.

Figure 5B:
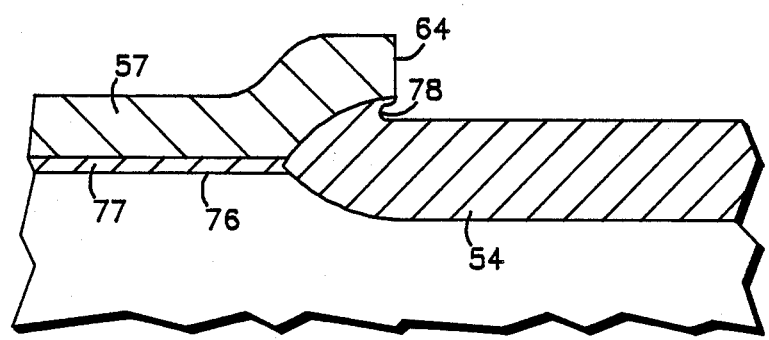

Shown in FIG. 5B is the effect of an isotropic etch which is applied to remove thin oxide layer 77 over areas not covered by the first polysilicon layer. In addition to a memory array such as shown in FIGS. 1-4, memory 10 has a periphery which includes circuits such as decoders, buffers, clock generators, and amplifiers. These peripheral circuits comprised mainly of transistors whose gates are formed by the second polysilicon layer. The active regions in the periphery are covered with gate oxide 77 which must be removed because areas of gate oxide 77 not covered by polysilicon are damaged during the processing which etches the first layer of polysilicon. Consequently, gate oxide layer 77 is desirably removed in those locations not covered by the first polysilicon layer. This is a conventional technique. The etch of oxide layer 77 is achieved with the use of hydrofluoric acid (HF). An HF etch is an isotropic etch which etches in all directions. An HF etch is selective between polysilicon and oxide so that oxide not covered by polysilicon is etched. Because the HF etch is isotropic, a small portion along an edge of polysilicon may be undercut. An undercut 78 is shown in FIG. 5B as underlying polysilicon strip 57 at edge 64.

Figure 5C:
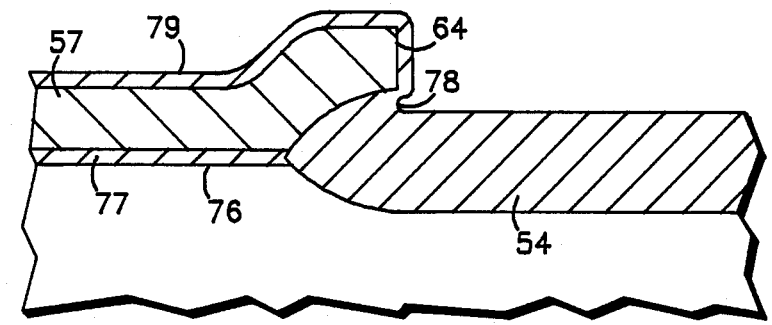

An interlayer dielectric 79 is then formed to insulate the first polysilicon layer from the second polysilicon layer. Formation of this dielectric may tend to reduce the undercut 78 but may not eliminate it. The undercut is shown in FIG. 5C after the formation of interlayer dielectric 79. Interlayer dielectric 79 may be formed of oxide or of a oxide-nitride-oxide combination or some other dielectric. Dielectric 79, in the preferred embodiment of the invention, is oxide and is used as the gate oxide for the transistors of the peripheral circuits. The same result as undercut 78 shown in FIG. 5D may result from the use of ONO even if the step shown in FIG. 5B is not used. Nitride is deposited and not grown so that there is essentially no nitride formed on edge 64. After the nitride is deposited, oxide is grown and will grow much faster on polysilicon edge 64 than on the nitride. This can result in the oxide growth on edge 64 being rounded so that there is the equivalent of undercut 78.

Figure 5D:
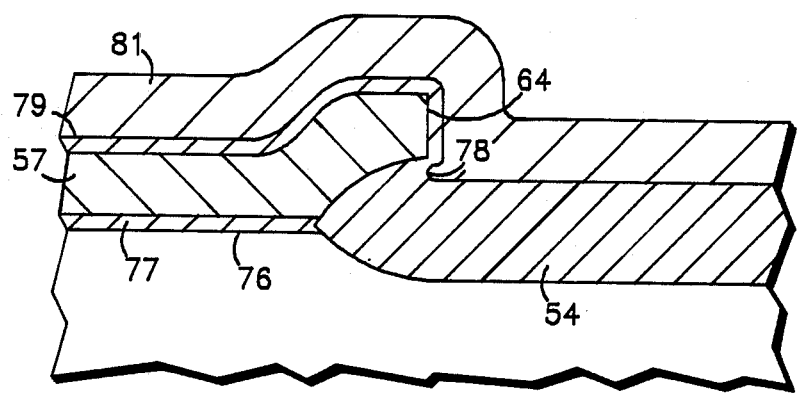
Figure 5E:
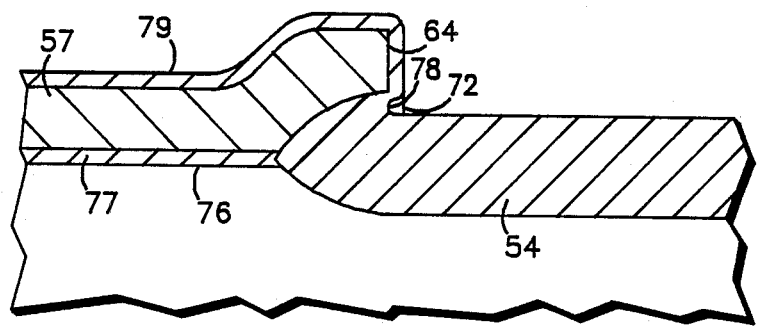
Figure 5F:
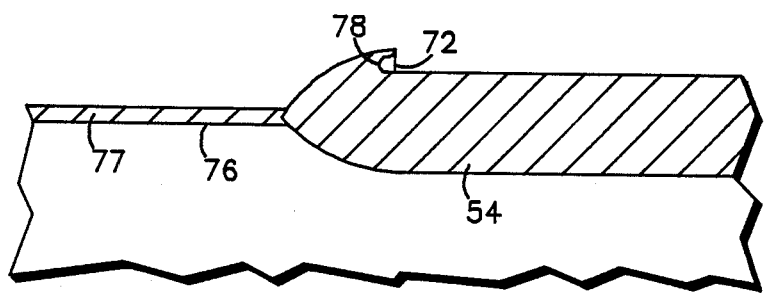

After dielectric layer 79 has been formed, the second polysilicon layer, shown as a polysilicon layer 81, is deposited. Because deposited polysilicon is very conformal, the deposited polysilicon is deposited in undercut 78 as well. This result is shown in FIG. 5D. After polysilicon layer 81 has been deposited, it is subjected to a plasma etch which is anisotropic. There is essentially only vertical etching. This is very desirable is most respects. There may, however, be some polysilicon left in undercut 78 which protects the polysilicon from the vertical etch, resulting in stringer 72. This result is shown in FIG. 5E. The anisotropic etching continues until dielectric 79 and polysilicon strip 57 are removed except in the areas that are masked. This etching may not etch field oxide sufficiently to remove undercut 78 so that stringer 72 will remain. It has been found then that stringers of the second layer of polysilicon may form along the edge of the first layer of polysilicon.

Figure 6:
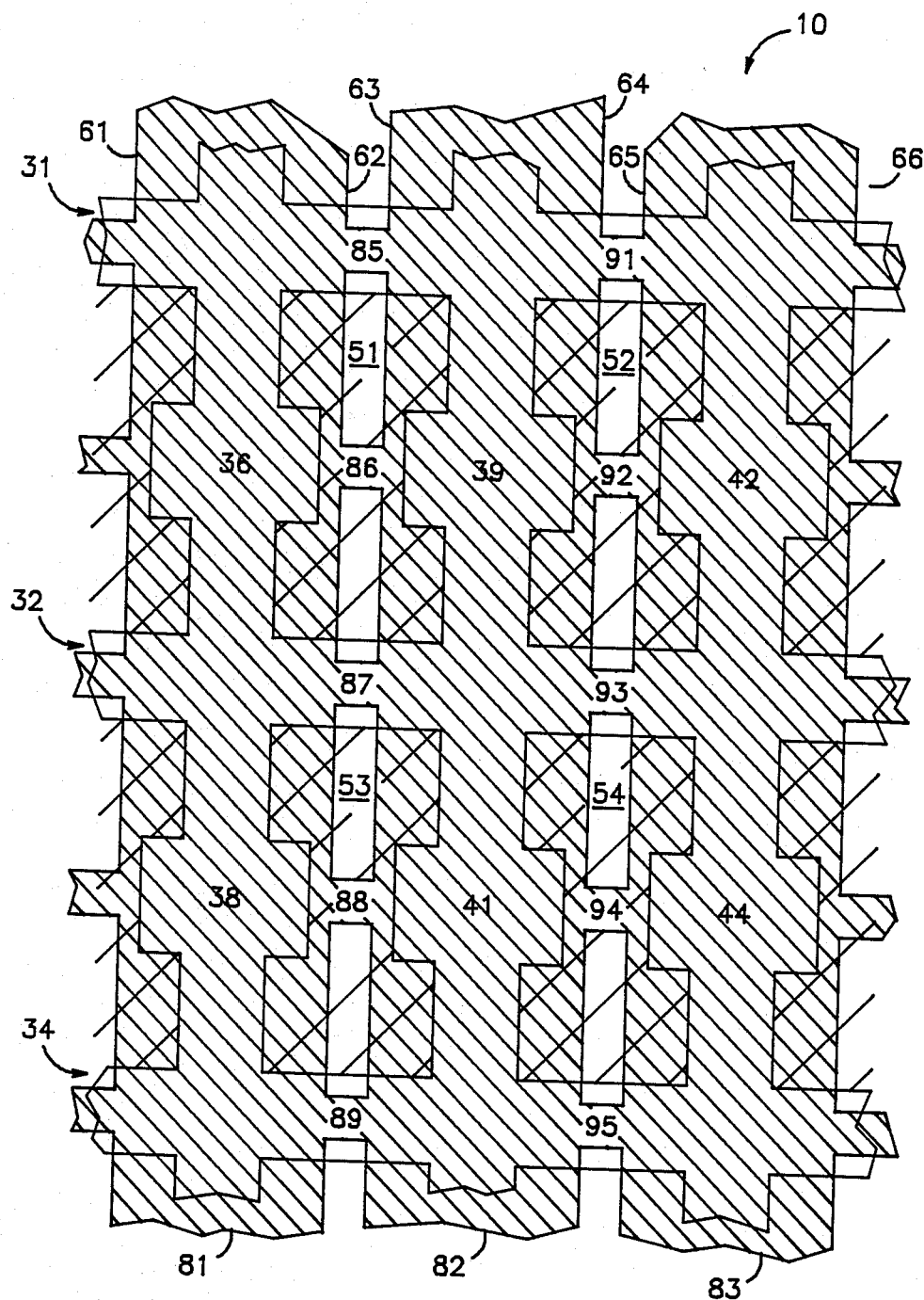
FIG. 6 is a topographical view of the memory of FIG. 1 with a polysilicon pattern, which replaces the conventional pattern shown in FIG. 3, according to a preferred embodiment of the invention.

Shown in FIG. 6 is a pattern of the first polysilicon layer which solves the problem of stringers shorting adjacent word lines together. The pattern shown in FIG. 6 is for replacing the pattern shown in FIG. 3. Instead of having polysilicon strips 56-58 which are completely separated, the pattern for the first layer of polysilicon shown in FIG. 6 includes periodic polysilicon bridges between polysilicon strips. Shown in FIG. 6 are polysilicon strips 81, 82, and 83 which are analogous to strips 56, 57, and 58, respectively. Strips 81-83, however, are connected by polysilicon bridges located between the bit line connection nodes and also along the common ground lines. Strip 81 is connected to strip 82 by a polysilicon bridges 85, 86, 87, 88, and 89. Bridge 85 is on common ground line 31. Bridge 86 is between bit line connection nodes 36 and 39. Bridge 87 is on common ground line 32. Bridge 88 is between bit line connection nodes 38 and 41. Bridge 89 is on common ground line 34. Strip 82 is connected to strip 83 by polysilicon bridges 91, 92, 93, 94, and 95. Bridge 91 is on ground line 31. Bridge 92 is between bit line connection nodes 39 and 42. Bridge 93 is on ground line 32. Bridge 94 is between bit line connection nodes 41 and 44. Bridge 95 is located on common ground line 34.

The polysilicon pattern shown in FIG. 6 blocks the potential stringer paths between word lines. In light of the potential stringer paths being along the etched edge of the first polysilicon layer, these etched edges are interrupted by bridges 85-89 and 91-95. Although stringers may still be formed they will not be harmful. The etched area between bridge 85 and 86, for example will have only one word line pass over it. Similarly, the etched area between bridge 86 and bridge 87 will have only one word line pass over it.

Figure 7:
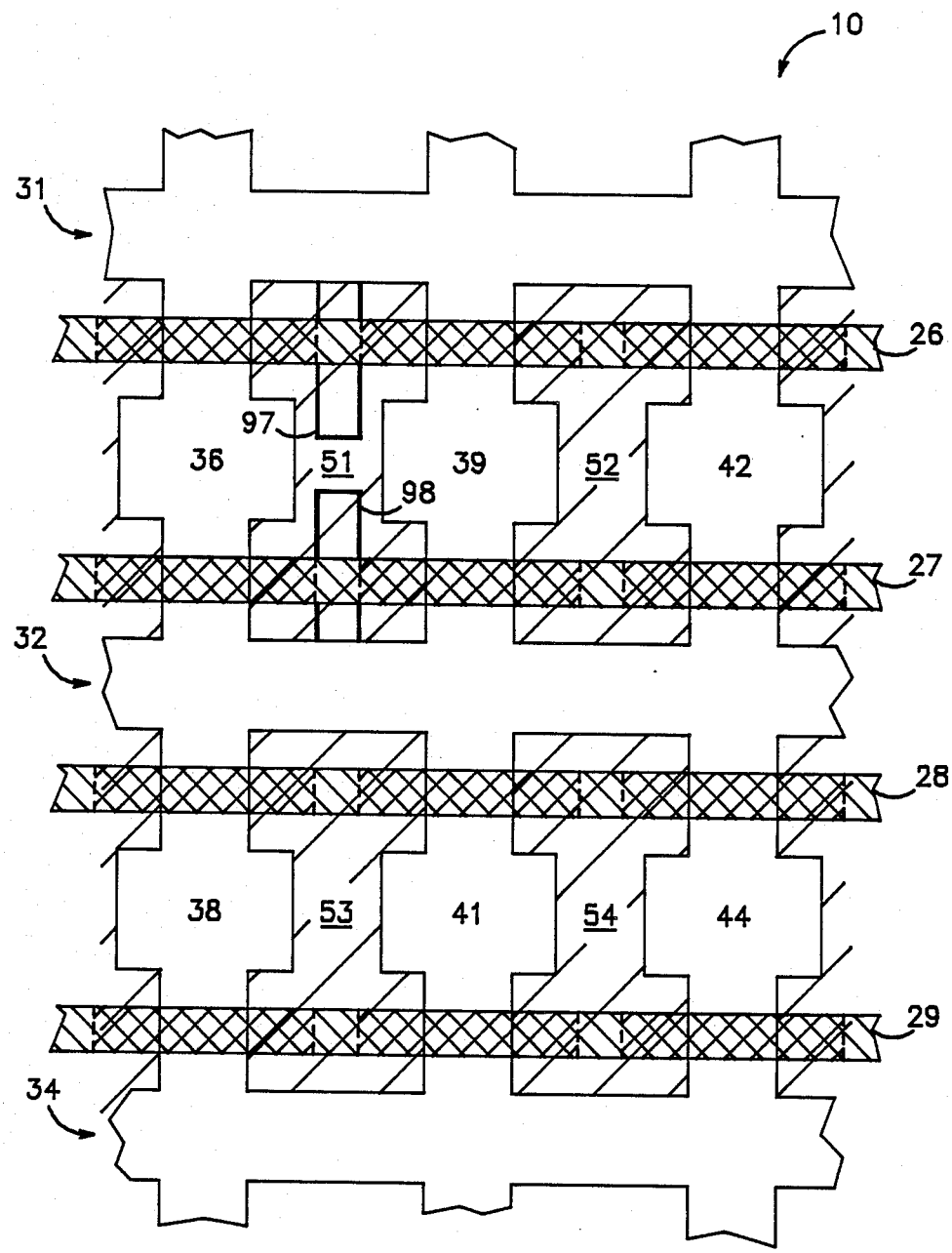
FIG. 7 is a topographical view of the memory of FIG. 1 after a stage in processing subsequent to that shown in FIG. 6.

Shown in FIG. 7 is the layout of FIG. 6 after the second polysilicon layer has been deposited and etched. Shown are stringers 97 and 98 which have occurred between word lines 26 and 27. Stringer 97 was formed along the edge of the etched first layer of polysilicon between bridge 85 and 86. Note that stringer 97 does not extend into common ground line 31. This is because a stringer is not likely to be formed over silicon. The stringers occur on the etched edged of the first polysilicon which is over field oxide. Stringer 98 was formed along the edge of the etched first layer of polysilicon between bridge 86 and bridge 87. The portion of stringer 97 which is between word line 26 and word line 27 loops back on itself, following the path of the edge of the etched first layer of polysilicon. By looping back on itself, stringer 97 is connected only to word line 26. Consequently, there is no deleterious shorting of two circuit elements. Similarly for stringer 98, stringer 98 follows the edge of the etched first layer of polysilicon and loops back on itself. Thus, stringer 98 is connected to only word line 27 and is thus harmless. The pattern of the etched first layer of polysilicon thus ensures against polysilicon stringers without requiring any change in a conventional process. Yield is thereby greatly enhanced by use of the pattern shown in FIG. 6.

The bridges of polysilicon, such as bridges 85, 87, 89, 91, 93, and 95, which are over common ground regions, such as regions 31, 32, and 34, are not really for preventing the extension of stringers but rather to reduce trenching in the common ground region. The area over the common ground region which is not covered by the first layer of polysilicon is etched more severely during the etching of the second layer of polysilicon. The etch of the second layer of polysilicon is continued to include an etch of the first layer because of the self-aligning process which is employed for floating gate transistors 11-22. Consequently, those areas of substrate which are not covered by the first layer of polysilicon will be etched during the etch which etches the first layer of polysilicon. Consequently, having a silicon bridge over the common ground region provides some additional protection against trenching of the substrate in this area.

We claim:

1. A patterned layer of first polysilicon for use in making an integrated circuit memory in a substrate having an array of floating gate transistors, each floating gate transistor having a control gate formed in a layer of second polysilicon which is formed after the patterned layer of first polysilicon is formed and being a portion of a respective word line, a floating gate formed from a portion of said patterned layer of first polysilicon, a drain formed in the substrate and connected to a respective bit line at a respective bit line connecting node formed in the substrate, and a source connected to a respective common source line formed in the substrate, said word lines running generally in a first direction, said bit lines overlying the bit line connecting nodes and running generally in a second direction which is generally orthogonal to the first direction, said common source lines running generally in the first direction; said patterned layer of first polysilicon comprising:

a plurality of strips of first polysilicon running generally in the second direction, each of said strips of first polysilicon overlying a single line of respective bit line connecting nodes and being adjaceet to at least one other strip; and a plurality of first bridges of first polysilicon running generally in the first direction and connecting the adjacent strips of first polysilicon, each of said first bridges aligned with two of the bit line connecting nodes, one of said two bit line connecting nodes being from each of the adjacent strips to which the particular bridge is connected.

2. The patterned layer of first polysilicon of claim 1 further comprising:

a plurality of second bridges of first polysilicon connected between the adjacent strips of first polysilicon and overlying the common source lines.

3. A patterned layer of first polysilicon for use in making an integrated circuit memory in a substrate having an array of floating gate transistors, each floating gate transistor having a control gate formed in a layer of second polysilicon which is formed after the patterned layer of first polysilicon is formed and being a portion of a respective word line, a floating gate formed from a portion of said patterned layer of first polysilicon, a drain formed in the substrate and connected to a respective bit line at a respective bit line connecting node formed in the substrate, and a source connected to a respective common source line formed in the substrate, said word lines running generally in a first direction, said bit lines overlying the bit line connecting nodes and running generally in a second direction which is generally orthogonal to the first direction, said common source lines running generally in the first direction; said patterned layer of first polysilicon comprising:

a plurality of strips of first polysilicon running generally in the second direction, each of said strips of first polysilicon overlying a single line of respective bit line connecting nodes and being adjacent to at least one other strip; and a plurality of bridges of first polysilicon connected between the strips of adjacent polysilicon bridges and overlying the common source lines.

* * * * *